US011132040B2

(12) United States Patent
Steele et al.

(10) Patent No.: US 11,132,040 B2
(45) Date of Patent: Sep. 28, 2021

(54) LOAD BALANCING IN MULTI-PORT POWER DELIVERY APPLICATIONS

(71) Applicant: Microchip Technology Incorporated, Chandler, AZ (US)

(72) Inventors: Brigham Steele, San Tan Valley, AZ (US); Andrew Rogers, Tempe, AZ (US); Shannon Cash, Cedar Park, TX (US); Matthew Kalibat, Austin, TX (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 321 days.

(21) Appl. No.: 16/146,232

(22) Filed: Sep. 28, 2018

(65) Prior Publication Data

US 2020/0012326 A1 Jan. 9, 2020

Related U.S. Application Data

(60) Provisional application No. 62/694,087, filed on Jul. 5, 2018.

(51) Int. Cl.
| | |
|---|---|
| *G06F 1/26* | (2006.01) |
| *G01R 21/133* | (2006.01) |
| *G05B 19/042* | (2006.01) |
| *G05F 1/66* | (2006.01) |
| *G06F 1/28* | (2006.01) |
| *G06F 13/38* | (2006.01) |
| *H02J 1/14* | (2006.01) |

(52) U.S. Cl.
CPC ........... *G06F 1/266* (2013.01); *G01R 21/133* (2013.01); *G05B 19/0421* (2013.01); *G05F 1/66* (2013.01); *G06F 1/28* (2013.01); *G06F 13/385* (2013.01); *H02J 1/14* (2013.01); *G06F 2213/0042* (2013.01)

(58) Field of Classification Search
CPC .......... G06F 1/266; G06F 1/28; G06F 13/385; G06F 2213/0042; G01R 21/133; G05B 19/0421; G05F 1/66; H02J 1/14
USPC ......................................................... 307/39
See application file for complete search history.

(56) References Cited

U.S. PATENT DOCUMENTS

| | | | |
|---|---|---|---|
| 2008/0244282 A1 | 10/2008 | Hansalia et al. | 713/300 |
| 2010/0171602 A1 | 7/2010 | Kabbara et al. | 340/333 |

(Continued)

OTHER PUBLICATIONS

International Search Report and Written Opinion, Application No. PCT/US2019/039143, 16 pages, dated Sep. 24, 2019.

*Primary Examiner* — Hal Kaplan
(74) *Attorney, Agent, or Firm* — Slayden Grubert Beard PLLC

(57) ABSTRACT

A Universal Serial Bus (USB) dock includes ports, a processor, and instructions to cause the processor, below a level of an operating system running applications and accessing the USB dock, identify a first port of the plurality of ports as a priority port. The processor may be further caused to detect a connection to the dock. The processor may be further caused to determine whether a candidate port to which the connection is made is the priority port. The processor may be further caused to, based on a determination that the candidate port is the priority port, recover power from other ports and advertise power capabilities of the priority port to a USB element connecting to the dock.

18 Claims, 5 Drawing Sheets

(56) References Cited

U.S. PATENT DOCUMENTS

| | | | |
|---|---|---|---|
| 2012/0144213 A1* | 6/2012 | Chang | G06F 1/3287 |
| | | | 713/300 |
| 2017/0046289 A1 | 2/2017 | Hundal et al. | 710/313 |

\* cited by examiner

LOAD BALANCING IN MULTI-PORT POWER DELIVERY APPLICATIONS

CROSS-REFERENCE TO RELATED APPLICATIONS

This application claims priority to U.S. Provisional Patent Application No. 62/694,087 filed Jul. 5, 2018, the contents of which are hereby incorporated in their entirety.

TECHNICAL FIELD

The present disclosure relates to power management and, more particularly, to systems and methods for load balancing in multi-port power delivery applications using ports such as Universal Serial Bus (USB) ports.

BACKGROUND

The USB 1.0 specification was originally developed in the 1990s to provide a bus and interface(s) to standardize communication between computers and peripheral devices, such as keyboards, printers, cursor pointing devices, external drives, and the like. Since then, USB has progressed into versions 2.0 and 3.0 and has become ubiquitous in computers as well as portable devices, such as smartphones, tablet computers, and MP3 players.

In general, in USB communication, one element acts as a host while another acts as a device. The host powers the bus, issues commands, and generally maintains control over the connection. The device does not initiate any activity for control of the bus. For example, a personal computer acts as a host to a USB "thumb" drive device.

The On-the-Go Specification allows a single host and single Device to swap roles. For example, some tablet computers may function in a device role and operate as a mass storage device when coupled to a personal computer host but may function as a host when coupled to peripheral devices such as a keyboard.

USB hubs expand a single USB port into several so that more elements can be connected. A personal computer or automotive entertainment system, for example, may include multiple external USB ports but have an internal dock, rather than dedicated USB controllers for each port. The Flex connect-enabled docks (USB 2.0 and USB 3.0 docks) produced by the Assignee of the present application are unique in the industry in that they can swap the upstream (host) side port with one of the downstream (device) side ports. In effect, for example, a dual role smartphone (host/device) can take over the dock from the downstream port. The Flexconnect feature, unique to Assignee manufactured dock devices, provides a crossbar switch on the die to reverse, for example, the USB dock host port (Port 0) and the downstream Port 1 which is where the smart phone could be connected as a USB device.

SUMMARY

Embodiments of the present disclosure include a Universal Serial Bus (USB) dock. The dock may include ports, a processor, and a non-transitory medium including instructions. The instructions, when loaded and executed on the processor, may cause the processor to, below a level of an operating system running applications and accessing the USB dock, identify a first port of the plurality of ports as a priority port. The processor may be further caused to detect a connection to the dock, determine whether a candidate port to which the connection is made is the priority port, and, based on a determination that the candidate port is the priority port, recover power from other ports and advertise power capabilities of the priority port to a USB element connecting to the dock. In combination with any of the above embodiments, the processor may be further caused to determine that the candidate port is the priority port, determine a power requirement of the USB element connecting to the dock through the candidate port, and, based on a determination that the candidate port is the priority port and a determination that the power requirement exceeds power unassigned to other ports, reclaiming power assigned to other ports. In combination with any of the above embodiments, the processor may be further caused to reclaim power assigned to other ports by resetting power usage of another USB element connected to one of the other ports such that the other USB element operates in a non-zero, diminished capacity. In combination with any of the above embodiments, the processor may be further caused to reclaim power assigned to other ports by resetting power usage of another USB element connected to one of the other ports such that the other USB element shuts off. In combination with any of the above embodiments, the processor may be further caused to, based on a determination that the candidate port is not the priority port, negotiate power allotment for the candidate port without recovering power from other ports. In combination with any of the above embodiments, the processor may be further caused to advertise power capabilities of the priority port to the USB element connecting to the dock by offering power connections to operate the USB element in modes that require more power than is unassigned in the dock. In combination with any of the above embodiments, the processor may be further caused to determine an amount of current drawn by an operating USB element attached to the dock, and, based on the amount of current drawn by the operating USB element, renegotiate power assignment to the operating USB element with the USB element. In combination with any of the above embodiments, the processor may be further caused to determine that the amount of current drawn by the operating USB element attached to the dock is below a given threshold, an, based on the determination that the amount of current drawn by the operating USB element attached to the dock is below the given threshold, renegotiate a current assignment with the operating USB element to a lower power operating mode. In combination with any of the above embodiments, the processor may be further caused to be based on a failed renegotiation of the current assignment with the operating USB element to the lower power operating mode, maintain the current assignment. In combination with any of the above embodiments, the processor may be further caused to determine that the amount of current drawn by the operating USB element attached to the dock is above a given threshold, based on the determination that the amount of current drawn by the operating USB element attached to the dock is above the given threshold, renegotiate current assignment with the operating USB element to a higher power operating mode.

Embodiments of the present disclosure may include laptops, mobile devices, computers, kiosks, charging stations, and servers including any of the docks of the above embodiments.

Embodiments of the present disclosure may include methods performed by any of the docks of the above embodiments.

DETAILED DESCRIPTION

Figure 1:
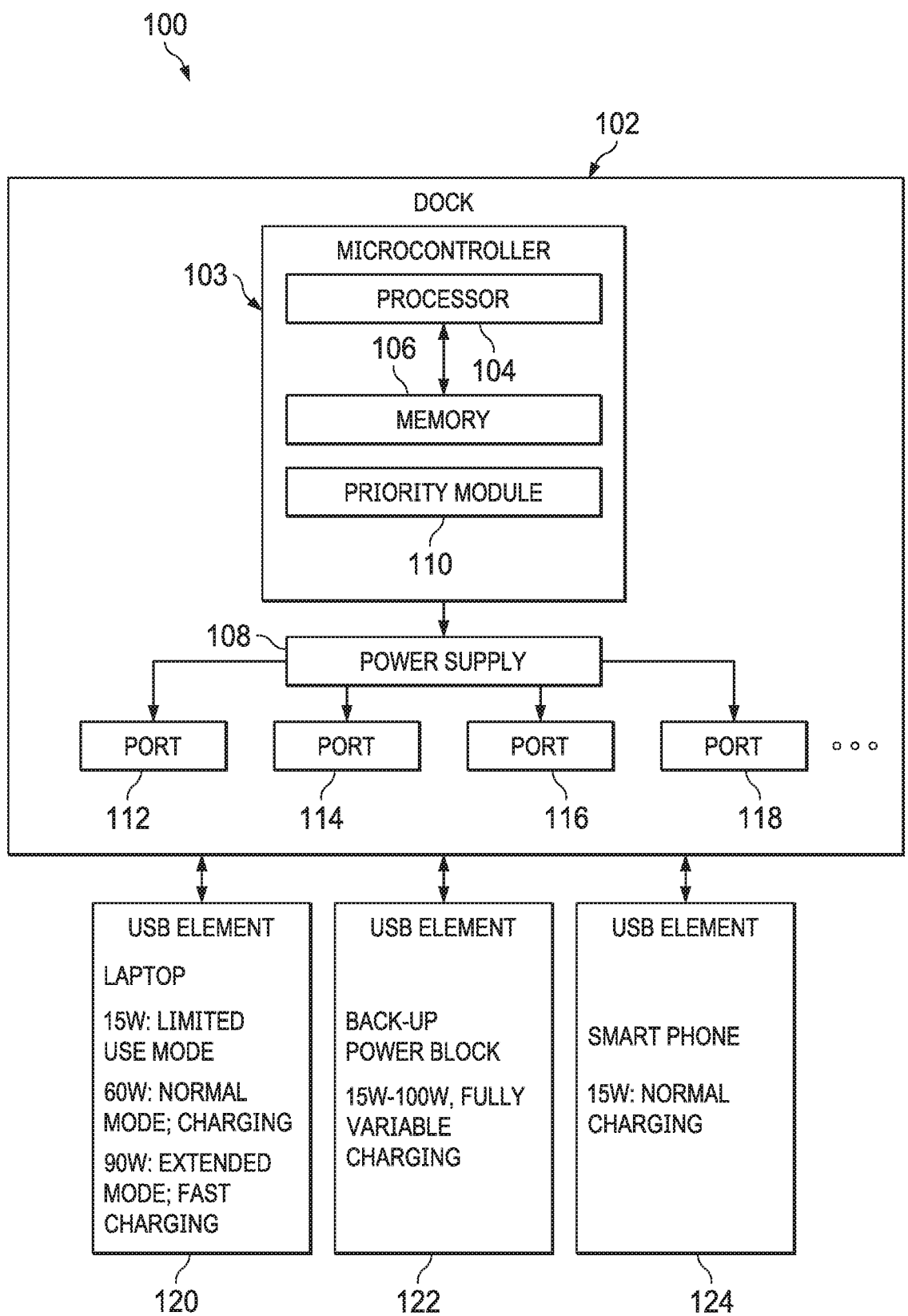
FIG. 1 is an illustration of a system for load balancing in multi-port power delivery applications, according to embodiments of the present disclosure.

FIG. 1 is an illustration of a system 100 for load balancing in multi-port power delivery applications, according to embodiments of the present disclosure. System 100 may be implemented in any suitable context, such as in a computer, power outlet, computer dock, charging station, power bank, charger, AC adapter, tablet, laptop, server, automobile, automobile breakout box, vehicle, plane, kiosk, appliance, network, or other electronic device with telecommunications ports. In one embodiment, the ports may be USB ports.

System 100 may include a dock 102. Dock 102 may be or may be included in a USB dock, computer, power outlet, computer dock, charging station, power bank, charger, tablet, laptop, server, automobile, vehicle, plane, kiosk, appliance, network, or other electronic device. In one embodiment, dock 102 may be configured to may be configured to interface with USB elements 120, 122, 124. In another embodiment, dock 102 may be configured to provide power to USB elements 120, 122, 124. Although three such elements are shown, dock 102 may include or interface with any suitable number and kind of elements.

Dock 102 may be configured to communicate with USB elements 120, 122, 124 through ports 112, 114, 116, 118. Dock 102 may include any suitable number and kind of ports. For example, ports 112-118 may be USB-Type C Power Delivery (PD) ports.

Dock 102 may include a processor 104 communicatively coupled to or including a memory 106. Memory 106 may include instructions that, when loaded and executed by processor 104, perform functionality of dock 102, such as priority module 110. In other cases, system 100 may include combinatorial logic or instructions written to hardware via a hardware description language. Priority module 110 may be implemented by instructions in memory 106 for execution by processor 104, or by hardware containing logic written through instructions, according to the teachings of the present disclosure. In some embodiments, priority module 110 may be implemented externally to dock 102, but may be communicatively coupled to dock 102 to provide the control signals and management described in the present disclosure. Processor 104 may be implemented in a microcontroller 103, and memory 106 may be included in microcontroller 103 or connected thereto. Accordingly, priority module 110 may be implemented within microcontroller 103. By implementation in microcontroller 103, priority module 110 might not need to rely upon operating systems, USB stack software, or other driver-level or user-level applications. Priority module 110 may execute at a ring of execution below such upon operating systems, USB stack software, or other driver-level or user-level applications.

Dock 102 may include a power supply 108. Power supply 108 may include connections to each of ports 112-118. The connections may be individually made, or may be made among a common power bus, wherein ports 112-118 are configurable to only use an amount of power as designated by priority module 110. Additional instances of power supply 108 may be used in dock 102, though a single instance of power supply 108 is illustrated for the sake of simplicity. Power supply 108 may be configured to power USB elements attached to ports 112-118. From time to time, a port such as port 118 might not be used for a time period.

Accordingly, microcontroller 103 and priority module 110 may be configured to manage power in dock 102. If dock 102 is designed to provide power to, and not provide USB communication between the elements attached thereto, dock 102 may be configured to use the USB power delivery (PD) protocol and variations thereof, but not portions of the USB communication protocol. In such a case, dock 102 might not be configured to act as a USB hub. However, in one embodiment dock 102 may be designed to provide power to as well as USB communication between the elements attached thereto, dock 102 may be configured to use the USB PD and communications protocol. In such a case, dock 102 may be configured to act as a USB hub.

In USB communication, a single USB element may be designated as a USB master among the USB elements 120, 122, 124. Other USB elements may be designated as a USB device among the USB elements 120, 122, 124. A port connected to a USB master may be considered an upstream port. A port connected to a USB device may be considered a downstream port. In such cases, dock 102 may provide appropriate switching, enumeration, translation, or other techniques to facilitate communication between USB elements 120, 122, 124. In various embodiments, the downstream or upstream nature of ports 112, 114, 116, 118, and the master or device nature of USB elements 120, 122, 124, may be fixed or dynamic. Dock 102 may include various technologies such that more than one USB element connected thereto is designated as a USB master.

In one embodiment, priority module 110 may be configured to determine priority among ports 112-118 for usage of power supply 108. The priority may be made for USB elements 120-124 connected to such ports. In another embodiment, priority module 110 may be configured to issue control signals or perform other management functions to route varying amounts of power between power supply 108 and respective ports 112-118.

In one embodiment, priority module 110 may be configured to operate at a level below driver, application level software, or user-level software that utilizes the USB software. Priority module 110 may be implemented in firmware or hardware and without application-level software needed to communicate between USB elements. Furthermore, even if dock 102 is implemented in a system that facilitates USB communication in addition to USB PD, the USB communication may be handled by separate processors or microcontrollers, or portions thereof. Thus, the USB PD functionality of priority module 110 may stand alone with regards to user-level, operating system-level, driver-level, application-level USB software or to USB communication.

As ports 112, 114, 116, 118 may have a physical component for users to attach or detach USB elements, a user may have to select into which of these ports a given USB element is to be plugged. Other implementations of a dock may include dedicated power levels for different ones of its respective ports. For example, a dock may include not only a plug, but a cord affixed to the plug for a USB element that is to have a higher power level. The dock may designate that the cord is to be used, for example, with or to charge a laptop. In another example, the dock may include pictures, markings, or other designations above each physical port to inform users about which port is to be used for a particular kind of device. For instance, a physical port with a 60 W capability may be labeled with an icon of a laptop or computer, indicating to users that of all the physical ports, that particular physical port is configured to power a laptop. In another instance, some physical ports may be configured as charge-only ports, while yet other physical ports are able to perform USB connections. In such an instance, the physical ports that are dedicated to charging and not to USB communication may be labeled "charge only" or with a power icon, rather than a USB icon or a laptop icon. While historically USB systems use power and data on a same connector, for a dock or application design, a power with higher power capability might be isolated, as described above. However, this may defeat the purpose of a "universal." Other implementations of a dock may be unable to provide a maximum amount of power, such as 60 W or 100 W, to each and every port. Providing such power to each and every power in other implementations may require hardware that is too large and expensive as each port is individually equipped with the requisite power supply.

In contrast, embodiments of the present disclosure may enable system 100 to support multiple powering capabilities, such as 60 W or 100 W, selectively to multiple ones of USB physical ports 112, 114, 116, 118 without such large and expensive power frames. In one embodiment, algorithms of priority module 110 may be configured to utilize the PD protocol USB elements 120, 122, 124 may have various power capabilities and requirements. USB elements 120, 122, 124 may be configured to operate in various modes, if so equipped, if sufficient power is available and to operate in diminished modes or to shut off or not connect if insufficient power is available.

For example, USB element 120 may be laptop. The laptop may be configured to use different power availability in different ways. For example, if provided 15 W, the laptop may operate in a diminished capacity. The diminished capacity may be, for example, running with dimmed displays and active processors and not charging a battery of the laptop. If provided 60 W, the laptop may operate in a normal capacity. The normal capacity may include running with normal display operations, active processors, and charging a battery of the laptop. If provided 100 W, the laptop may operate in a super-charging capacity, wherein the batter is charged faster than if provided 60 W.

In another example, USB element 122 may be a USB wireless charger or charge block. USB element 122 may be configured to be a back-up portable charger and may need to itself be charged. USB element 122 may be configured to accept anywhere between 15 W and 100 W, and may charge itself faster based upon the charge provided to it from power supply 108.

In yet another example, USB element 124 may be a smart phone. Smart phone may receive normal charging at 15 W.

Each of USB elements 120, 122, 124 may be configured to enter a negotiation with dock 100 upon connecting to dock 100. The negotiation may be performed according to the PD or other USB standards. The negotiation may include the USB element identifying itself or its type of device, and its possible power needs. The negotiation may include dock 100 offering or advertising available power. The available power may be rejected or accepted, and a different available power may be offered subsequently. Dock 100 and the respective USB element may later renegotiate power.

In one embodiment, priority module 110 may assign a priority between USB ports 112, 114, 116, 118. The priority may include any suitable quantification or number of levels. The priority may be used to assign quantifications of power to individual USB elements attached to USB ports 112, 114, 116, 118. The priority may cause priority module 110 to advertise or offer specific power to the USB elements through negotiations. Furthermore, priority module 110 may be configured to reassign priority between USB ports 112, 114, 116, 118 from time to time, or upon changing conditions. Priority may be reassigned by priority module 110 and thus cause renegotiations.

Power supply 108 may include an amount of available current or power that when applied to various ports may cause a reduction in available current or power to other ports. For example, power supply 108 may be configured to provide 150 total watts. Priority module 110 may maintain a budget or tabulation of assigned power to various ports. Priority module 110 may be configured to reclaim power from ports by taking away power from a port for a higher priority port, or by taking away power when a USB element disconnects.

In one embodiment, priority module 110 may advertise to elements connecting to the priority port the highest power capability. This may be performed regardless of the connection status of the other ports. The connection status of the other ports may be degraded to make an allowance for the priority port. Thus, priority module 110 may advertise greater than the actual available budgeted power with the foreknowledge that other elements will have their power throttled for the sake of the priority port.

If the element attaching to the priority port cannot use the entire amount of the available power that is advertised, it may use as much power as it is configured to use. For example, element 124 connecting to a priority port might only use 15 W, even if 100 W is advertised and available. However, element 120 may use 90 W and element 122 might use 100 W in analogous situations.

Ports other than the priority port may consequently need to renegotiate power when a USB element is connected to the priority port. Priority module 110 may be configured to perform subsequent renegotiations for one or more elements whose power allotment was degraded.

Priority module 110 may switch which port is the priority port based on, for example, a timer, battery status query, or button press by a user of the system. This may allow the user of the system to get a consistent experience over time regardless of which port or which order the devices are connected.

Priority module 110 may define operations for when a device is connected to a PD port. Because priority module 110 is already running the power delivery stack, priority module 110 will interact with that stack at the connection detection stage. When a device is connected, priority module 110 will determine if the port is the priority port, or another port. If the port connected is the priority port, priority module 110 will evaluate the connection status of all the other connected ports to determine if there is enough power to advertise the maximum desired power capabilities. If there is not enough power, then priority module 110 will disconnect the other ports until there is enough power available to advertise the maximum desired power. The other ports will all adjust their power capabilities lower according to the remaining power budgeted.

Priority module 110 may switch which port is given priority. This may improve the user experience so that all devices will end up being charged equally after a long period of time. The user might not want to see two identical devices charge differently depending on the order that they were connected, or which port they were connected to. This can be done via a timeout, through a query using the PD specification to check on battery status, or through user control from a GPIO of the processor. The timeout may be, for example, 10 seconds.

Most PD are one-port connections to a management processor. To do system power balancing, the solutions requires a UCSI protocol that goes to the operating system to communicate the port status. In contrast, embodiments of the present disclosure may be enabled at the port management level instead of the system management level.

USB-IF defined a method where the ports must change their advertised power capabilities based on the maximum available power after other ports are connected. This is not desirable because users will have different experiences depending on the order of devices connected to a multi-port system, and some devices may not charge at all if a high-power device is connected first.

Figure 2A:
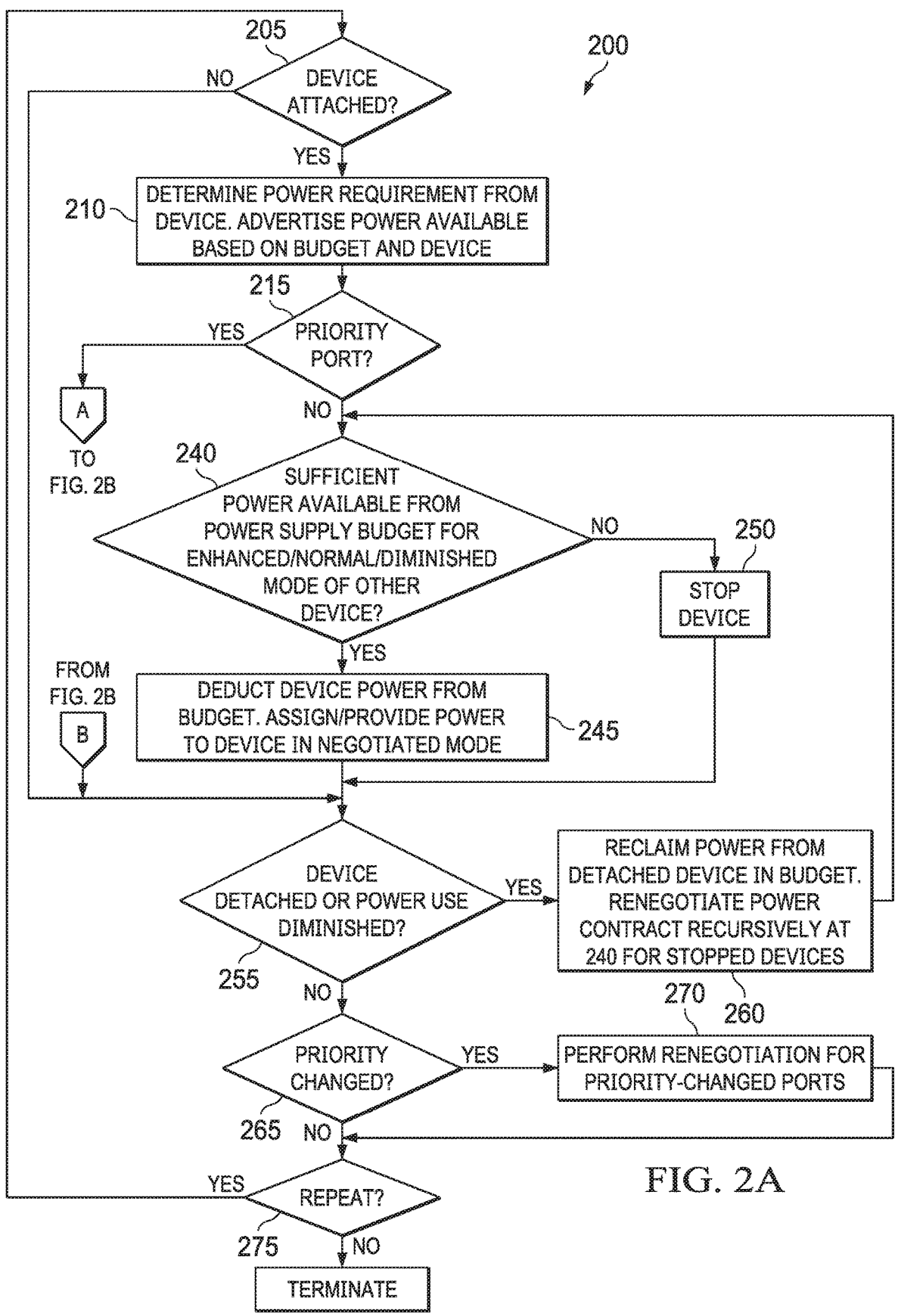
FIGS. 2A and 2B illustrate a method of operation of a priority module to handle power negotiations based on a power priority, according to embodiments of the present disclosure.
Figure 2B:
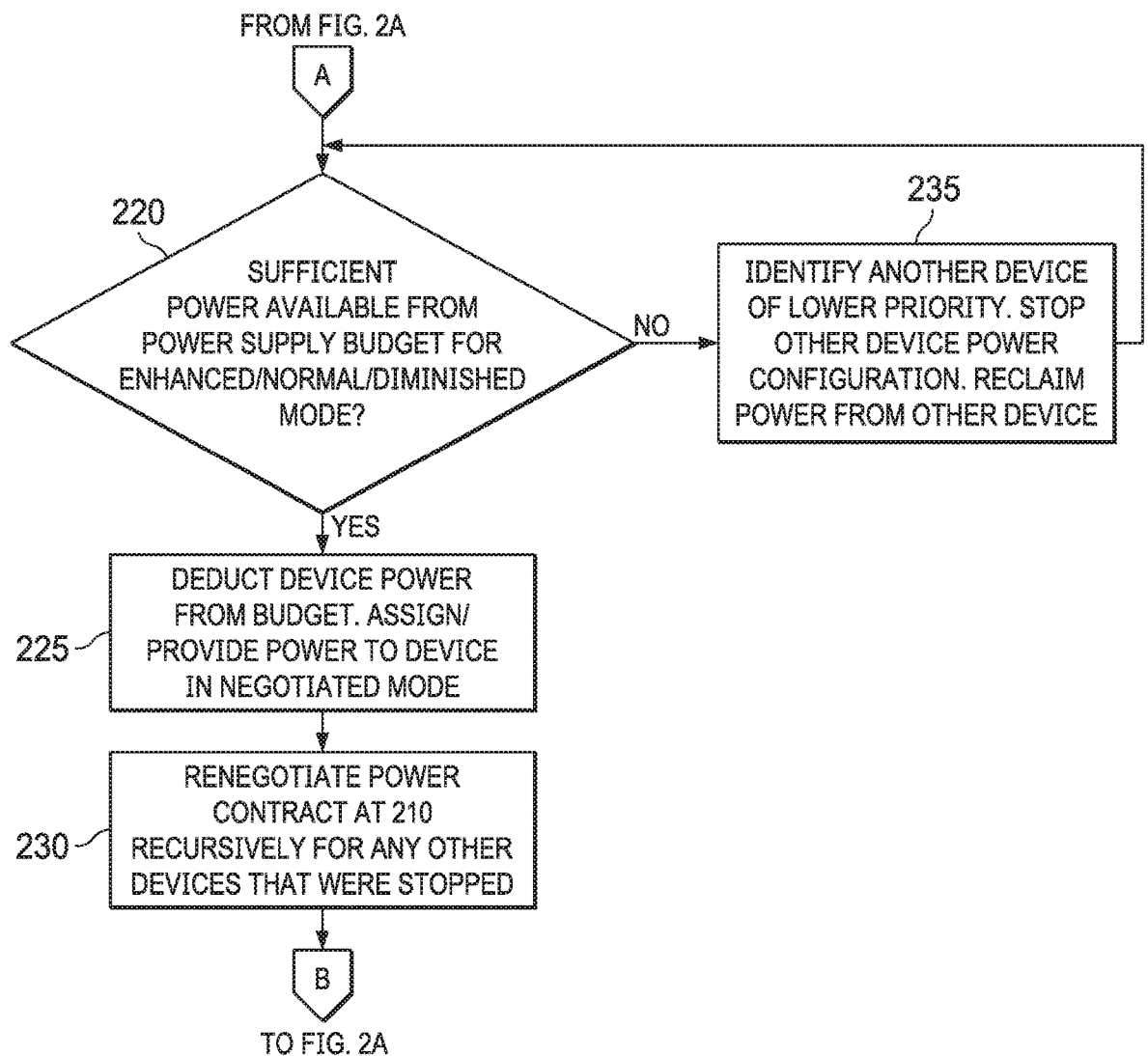

FIGS. 2A and 2B illustrate a method 200 operation of priority module 110 to handle power negotiations based on a power priority, according to embodiments of the present disclosure.

At 205, dock 100 may determine whether a USB element has been attached to one of the ports. If no USB element has been attached, method 200 may proceed to 255. If a USB element has been attached, priority module 110 may determine a power requirement from the USB element. Priority module 110 may advertise the power that is available for the USB element based upon an identity of the USB element, the available power from a budget for power supply 108, and priority. At 215, priority module 110 may determine whether the port to which the USB element has been attached is a high priority port. If so, method 200 may proceed to 220. Otherwise, method 200 may proceed to 240.

At 220, a power negotiation may be performed by priority module 110 and the attached element. The power negotiation may be performed in any suitable number of steps and iterations. The number of power negotiation steps may be based on how soon a power delivery amount is agreed upon between priority module 110 and the attached element. The power negotiation may include a query of whether a certain amount of available power from power supply 108 is acceptable for a given mode of operation of the attached element. The power negotiation may include subsequent queries of whether amounts of available power are acceptable for still other given modes of operation of the attached element. In one embodiment, if the element is attached to a priority port, then the negotiation may start with higher amounts of available power and enter an acceptable operation mode. The modes may include any suitable mode related to available power configured on the element, such as an enhanced, normal, or diminished mode. For example, if 100 W are available in the power budget, and a laptop attaches to dock 100, priority module 110 may advertise or offer the laptop 90 W. If the laptop accepts 90 W, then the negotiation may be concluded. However, if only 80 W are available, priority module 110 may offer and the laptop may accept a 60 W power contract. If only 40 W are available, priority module 110 may offer and the laptop may accept a 15 W power contract. At 220, if an acceptable level of power is not available, method 200 may proceed to 235. If an acceptable level of power is available, method 200 may proceed to 225.

At 225, the power may be accepted by the element. The power assigned may be deducted from the overall power budget by priority module 110. The element may operate in the designated mode according to the power that was assigned. At 230, power contracts may be renegotiated for any elements that were previously stopped or paused for power management, as discussed further below. These negotiations may be performed for each such element and may be performed through recursive or additional execution of, for example, method 200 at 210. Method 200 may proceed to 255.

At 235, wherein insufficient power is available for the attached element, priority module 110 may reclaim power from another port or device attached to dock 100. Priority module 110 may identify a port of lower priority. An element attached to such another port may be paused, unenumerated, or stopped temporarily. The power assigned to the element attached to the lower priority port may be reclaimed by priority module 110 and added to the available budget. Method 200 may return to 220 to determine whether sufficient power has been reserved for the newly attached element, or whether additional elements are to have their power redirected to the new higher priority, newly attached element.

At 240, wherein the port to which the newly attached element has been affixed is not a priority port, it may be determined by priority module 110 whether sufficient power is available for any given mode for the newly attached mode. Priority module 110 may be configured to perform a power negotiation similar to that performed in 220-225. In one embodiment, priority module 110 may be configured to determine whether the element can accept a power assignment from power supply 108 in a diminished, normal, or enhanced mode. If a power negotiation can be successfully negotiated, method 200 may proceed to 245. Otherwise method 200 may proceed to 250.

At 245, the power may be accepted by the element. The power assigned may be deducted from the overall power budget by priority module 110. The element may operate in the designated mode according to the power that was assigned. Method 200 may proceed to 255.

At 250, the element may be paused, unenumerated, or stopped temporarily. Method 200 may proceed to 255.

At 255, priority module 110 may determine whether a device has been detached, or whether a device has had its power usage diminished. The device may have had its power usage diminished by, for example, steps 235 or 255. A device may have been detached through user action. If a device has been detached or power usage diminished, method 200 may proceed to 260. Otherwise, method 200 may proceed to 265.

At 260, the power that was previously used by the device that was detached or had its power usage diminished may be reclaimed and added back to the overall power budget. If needed, power devices with their power usage diminished may enter renegotiation. This may be performed, for example, by recursive or parallel execution of step 240 for such other elements.

At 265, it may be determined whether priority module 110 is to change the priority of the ports. If so, at 270 renegotiations may be performed for ports whose priority changed, whether up or down. If not, at 275 it may be determined whether method 200 is to repeat. If not, method 200 may terminate. Otherwise, method 200 may repeat at, for example, 205.

Figure 3:
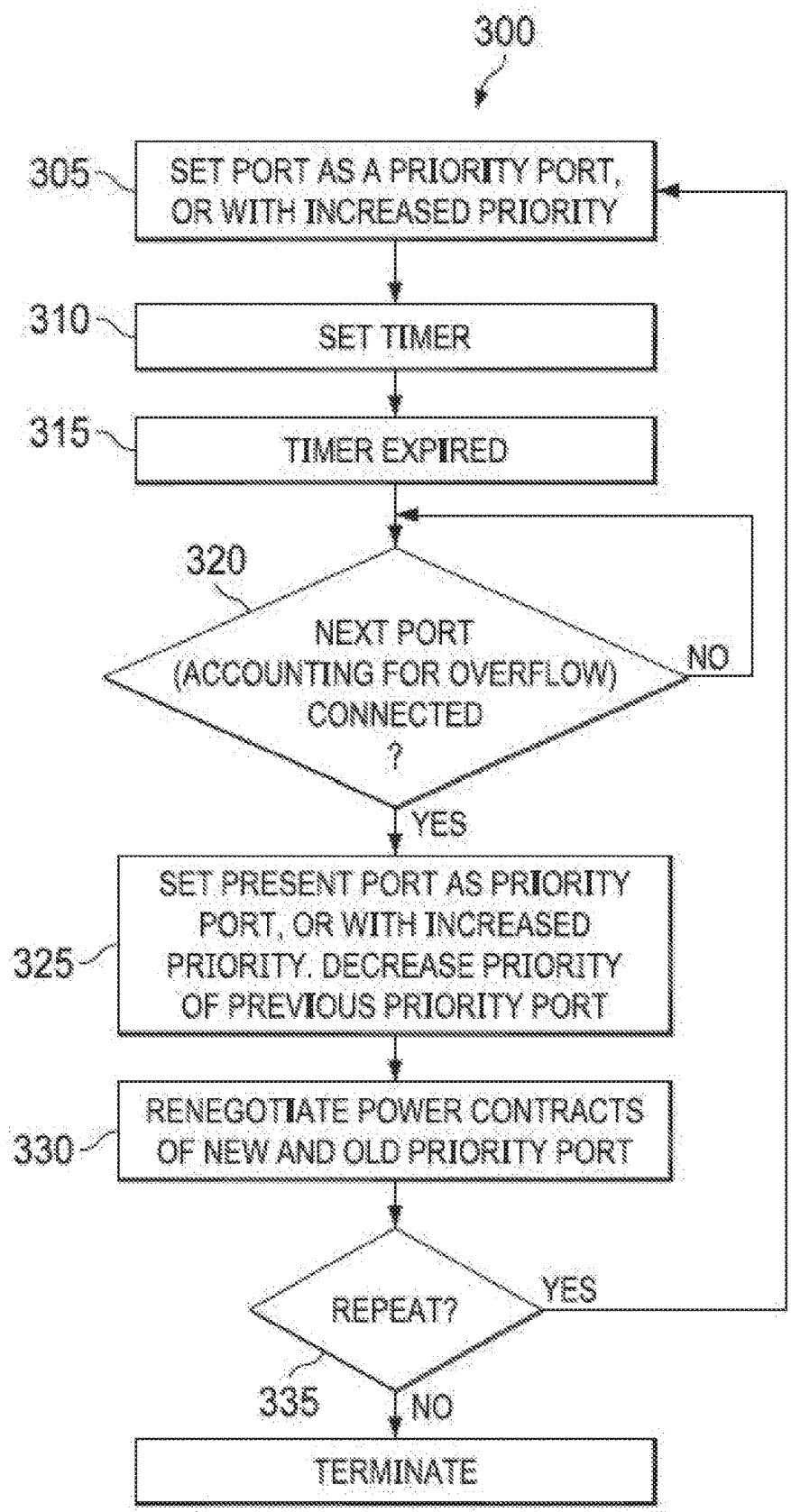
FIG. 3 is an illustration of an example method for determining a priority of ports, according to embodiments of the present disclosure.

FIG. 3 is an illustration of an example method 300 for determining a priority of ports, according to embodiments of the present disclosure. Method 300 may illustrate a round-robin selection for determining a priority.

At 305, a port may be established as a priority port, or a port may have been previously established as a priority port.

At 310, priority module 110 may set a timer or countdown. The timer may be, for example, 1-10 seconds.

At 315, the timer may expire.

At 320, priority module 110 may check whether a next port has an element connected. If so, method 200 may proceed to 325. If not, method 200 may repeat 320 for checking yet another, further port. In the case that an end of the available ports is reached, a port at the beginning of a list of ports may be checked, and so on. Method 200, finding no elements connected to other ports, may arrive back at the original port set as a priority port before the successive performances of 320. In such a case, the original port set as a priority port may be maintained as a priority port.

At 325, the connected port identified in 320 may be set as a priority port or may have its priority increased. A previous, different port identified as a priority port may be de-designated as the priority port or have its priority decreased.

At 330, power contracts for the ports whose priority has changed, whether up or down, may be renegotiated. The power contract for the higher priority port may be performed first so as to offer the higher priority port a larger available power. Negotiation may be performed as discussed above in the context of FIG. 2.

At 335, method 300 may optionally repeat at, for example, 305.

In some embodiments, port priority as shown in FIG. 3 may be interrupted by, or supplanted by, a user of dock 100 asserting a higher priority for a given port. This may be performed by, for example, a switch, push button, or other user input. In such a case, the round-robin process may be paused indefinitely. The round-robin process may resume, for example, when the push button is released or toggled again, or when an element attached to the newly-prioritized port is detached.

Figure 4:
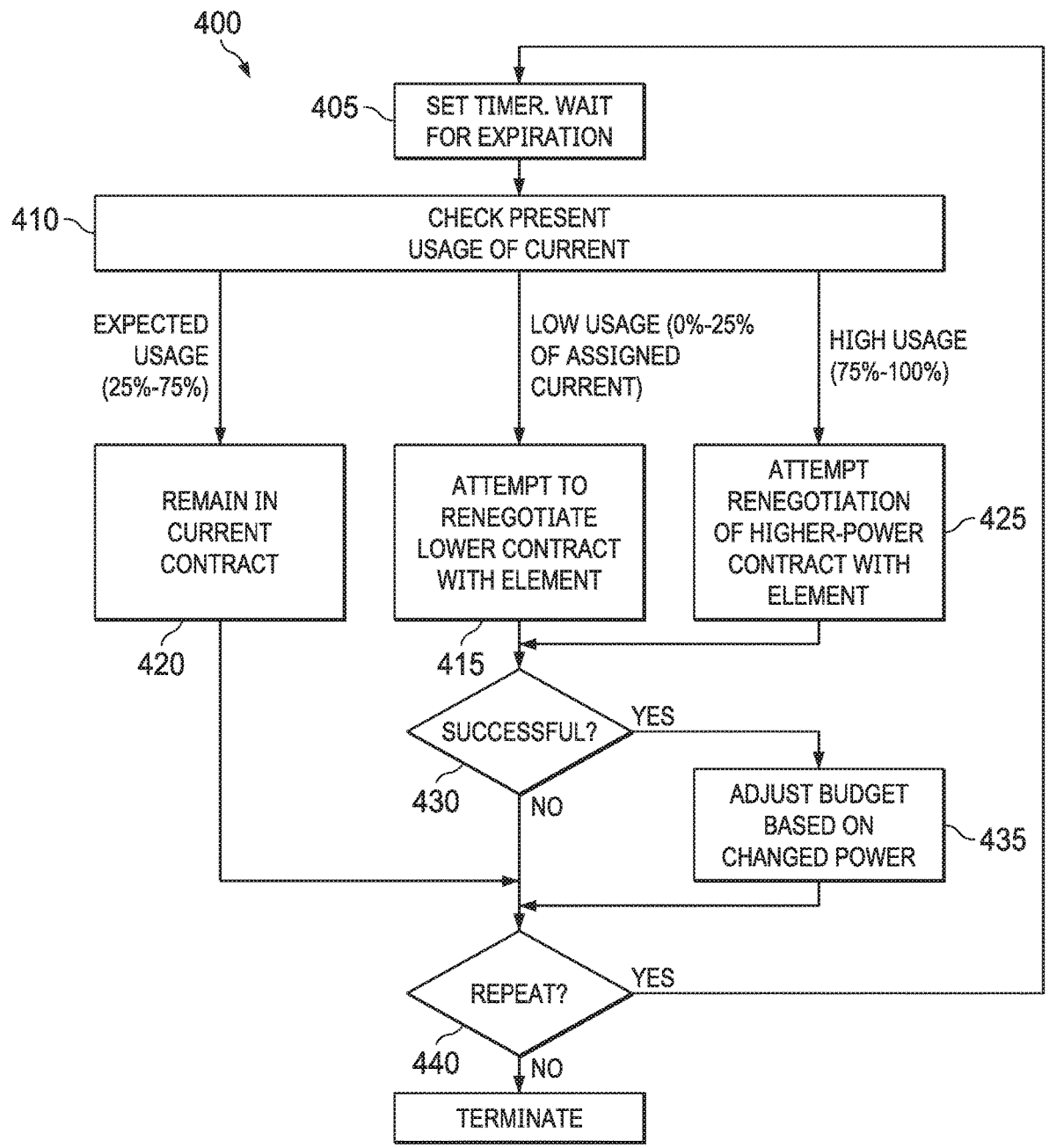
FIG. 4 illustrates an example method of adjusting power based upon current draw, according to embodiments of the present disclosure.

FIG. 4 illustrates an example method 400 of adjusting power based upon current draw, according to embodiments of the present disclosure. Method 400 may be performed in addition to, or by replaced portions of, methods 200 and 300. For example, method 400 may operate in parallel to the power management method 200. Method 400 may adjust power contracts and, in doing so, change priority of involved ports. Method 400 may adjust power contracts while maintaining existing priority of involved ports. Method 400 may adjust power budgeting that may then be reacted to, for example, in 255 wherein power use has been diminished or 265 where priority has changed.

Method 400 may be configured to be performed on any suitable basis or criteria. For example, method 400 may be performed upon an overall low or high current condition on power supply 108, upon attachment or detachment of any element, or periodically. Method 400 may be performed separately for each port that has a USB element attached thereto. At 405, priority module 110 may set a timer. The timer may be, for example, 1-10 seconds. Upon expiration of the timer, at 410, priority module 110 may check present usage of current in the element attached to the port.

At 410, the usage of current by the attached element may be evaluated. The actual usage of current may vary from the assigned or reserved power budget for the element. For example, while a laptop may be assigned 90 W so that it may charge quickly, its battery may be fully charged. Thus, the laptop might not be drawing the full current to which it is allotted. Any suitable granularity of analysis may be performed. For example, it may be determined whether the attached element is using low, expected, or high usage of its assigned power. The low usage may be defined, for example, as using less than 25% of the assigned current. The expected usage may be defined, for example, as using between 25% and 75% of the assigned current. The high usage may be defined, for example, as using more than 75% of the assigned current. Other suitable thresholds may be used instead for each of these categories. More or fewer categories may be used. If low usage is detected, method 400 may proceed to 415. If expected usage is detected, method 400 may proceed to 420. If high usage is detected, method 400 may proceed to 425.

At 415, the power contract for the element may be renegotiated to a lower usage. For example, if the existing power contract was for enhanced mode of 90 W for the laptop, the power contract may be renegotiated such that priority module 110 offers normal mode of 60 W to the laptop. Method 400 may proceed to 430.

At 420, the power contract for the element may remain in its present form. Method 400 may proceed to 440.

At 425, the power contract for the element may be renegotiated to a higher usage, if available from the power budget. For example, if the existing power contract was for normal mode of 60 W for the laptop, the power contract may be renegotiated such that priority module 110 offers enhanced mode of 90 W to the laptop. Method 400 may proceed to 430.

At 430, it may be determined whether the negotiation was successful. The negotiation might be unsuccessful if the offered mode is unacceptable to the element, if no higher or lower mode is available, or if insufficient power is available from power supply 108. If not, method 400 may proceed to 440 and existing power contracts may be maintained. If so, method 400 may proceed to 435.

At 435, the power budget may be adjusted based upon any changes that have been made. Moreover, any priority changes that are required as a consequence may be made. Method 400 may proceed to 440.

At 440, method 400 may optionally repeat at 405 or terminate.

Methods 200, 300, 400 may be initialized at any point. Methods 200, 300, 400 may contain fewer or more steps than are illustrated the figures. The steps of methods 200, 300, 400 may be optionally repeated or omitted. Multiple instances of methods 200, 300, 400, or portions of methods 200, 300, 400, may be executed recursively or in parallel with each other. The steps of methods 200, 300, 400 may be performed by priority module 110 or another suitable part of dock 100.

Although example embodiments have been described above, other variations and embodiments may be made from this disclosure without departing from the spirit and scope of these embodiments.

The invention claimed is:

1. A Universal Serial Bus (USB) dock, comprising:
a plurality of ports;
a processor; and
a non-transitory medium including instructions, the instructions, when loaded and executed on the processor, are configured to cause the processor to, below a level of an operating system, the operating system configured to run applications and access the USB dock:
  identify a first port of the plurality of ports as a priority port;
  detect a connection to the dock;
  determine whether a candidate port to which the connection is made is the priority port; and
  based on a determination that the candidate port is the priority port, recover power from other ports and advertise power capabilities of the priority port to a USB element connecting to the dock;
  wherein advertising power capabilities of the priority port to the USB element connecting to the dock includes offering power connections to operate the USB element in modes that require more power than is unassigned in the dock.

2. The USB dock of claim 1, further comprising instructions for causing the processor to:
  determine that the candidate port is the priority port;
  determine a power requirement of the USB element connecting to the dock through the candidate port; and
  based on a determination that the candidate port is the priority port and a determination that the power requirement exceeds power unassigned to other ports, reclaiming power assigned to other ports.

3. The USB dock of claim 2, wherein reclaiming power assigned to other ports includes resetting power usage of another USB element connected to one of the other ports such that the other USB element operates in a non-zero, diminished capacity.

4. The USB dock of claim 2, wherein reclaiming power assigned to other ports includes resetting power usage of another USB element connected to one of the other ports such that the other USB element shuts off.

5. The USB dock of claim 1, further comprising instructions for causing the processor to, based on a determination that the candidate port is not the priority port, negotiate power allotment for the candidate port without recovering power from other ports.

6. A Universal Serial Bus (USB) dock, comprising:
  a plurality of ports;
  a processor; and
  a non-transitory medium including instructions, the instructions, when loaded and executed on the processor, are configured to cause the processor to, below a level of an operating system, the operating system configured to run applications and access the USB dock:
    identify a first port of the plurality of ports as a priority port;
    detect a connection to the dock;
    determine whether a candidate port to which the connection is made is the priority port;
    based on a determination that the candidate port is the priority port, recover power from other ports and advertise power capabilities of the priority port to a USB element connecting to the dock; and
    determine an amount of current drawn by an operating USB element attached to the dock; and
    based on the amount of current drawn by the operating USB element, renegotiate power assignment to the operating USB element with the USB element.

7. The USB dock of claim 6, further comprising instructions for causing the processor to:
  determine that the amount of current drawn by the operating USB element attached to the dock is below a given threshold; and
  based on the determination that the amount of current drawn by the operating USB element attached to the dock is below the given threshold, renegotiate a current assignment with the operating USB element to a lower power operating mode.

8. The USB dock of claim 7, further comprising instructions for causing the processor to:
  based on a failed renegotiation of the current assignment with the operating USB element to the lower power operating mode, maintaining the current assignment.

9. The USB dock of claim 6, further comprising instructions for causing the processor to:
  determine that the amount of current drawn by the operating USB element attached to the dock is above a given threshold; and
  based on the determination that the amount of current drawn by the operating USB element attached to the dock is above the given threshold, renegotiating current assignment with the operating USB element to a higher power operating mode.

10. A method of operating a Universal Serial Bus (USB) dock, the USB dock comprising a plurality of ports and a processor, the method including, below a level of an operating system, the operating system running applications and accessing the USB dock:
  identifying a first port of the plurality of ports as a priority port;
  detecting a connection to the dock;
  determining whether a candidate port to which the connection is made is the priority port; and
  based on a determination that the candidate port is the priority port, recovering power from other ports and advertising power capabilities of the priority port to a USB element connecting to the dock;
  wherein advertising power capabilities of the priority port to the USB element connecting to the dock includes offering power connections to operate the USB element in modes that require more power than is unassigned in the dock.

11. The method of claim 10, further comprising:
  determining that the candidate port is the priority port;
  determining a power requirement of the USB element connecting to the dock through the candidate port; and
  based on a determination that the candidate port is the priority port and a determination that the power requirement exceeds power unassigned to other ports, reclaiming power assigned to other ports.

12. The method of claim 11, wherein reclaiming power assigned to other ports includes resetting power usage of another USB element connected to one of the other ports such that the other USB element operates in a non-zero, diminished capacity.

13. The method of claim 11, wherein reclaiming power assigned to other ports includes resetting power usage of another USB element connected to one of the other ports such that the other USB element shuts off.

14. The method of claim 10, further comprising, based on a determination that the candidate port is not the priority port, negotiating power allotment for the candidate port without recovering power from other ports.

15. A method of operating a Universal Serial Bus (USB) dock, the USB dock comprising a plurality of ports and a processor, the method including, below a level of an operating system, the operating system running applications and accessing the USB dock:
- identifying a first port of the plurality of ports as a priority port;
- detecting a connection to the dock;
- determining whether a candidate port to which the connection is made is the priority port;
- based on a determination that the candidate port is the priority port, recovering power from other ports and advertising power capabilities of the priority port to a USB element connecting to the dock;
- determining an amount of current drawn by an operating USB element attached to the dock; and
- based on the amount of current drawn by the operating USB element, renegotiating power assignment to the operating USB element with the USB element.

16. The method of claim 15, further comprising:
- determining that the amount of current drawn by the operating USB element attached to the dock is below a given threshold; and
- based on the determination that the amount of current drawn by the operating USB element attached to the dock is below the given threshold, renegotiating a current assignment with the operating USB element to a lower power operating mode.

17. The method of claim 16, further comprising:
- based on a failed renegotiation of the current assignment with the operating USB element to the lower power operating mode, maintaining the current assignment.

18. The method of claim 15, further comprising:
- determining that the amount of current drawn by the operating USB element attached to the dock is above a given threshold; and
- based on the determination that the amount of current drawn by the operating USB element attached to the dock is above the given threshold, renegotiating current assignment with the operating USB element to a higher power operating mode.

\* \* \* \* \*